US009449924B2

United States Patent
Takaki

(10) Patent No.: US 9,449,924 B2
(45) Date of Patent: Sep. 20, 2016

(54) MULTILEVEL CONTACT TO A 3D MEMORY ARRAY AND METHOD OF MAKING THEREOF

(71) Applicant: SanDisk 3D LLC, Milpitas, CA (US)

(72) Inventor: Seje Takaki, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 192 days.

(21) Appl. No.: 14/136,103

(22) Filed: Dec. 20, 2013

(65) Prior Publication Data

US 2015/0179659 A1 Jun. 25, 2015

(51) Int. Cl.
| | |
|---|---|
| H01L 27/115 | (2006.01) |
| H01L 23/535 | (2006.01) |
| H01L 21/768 | (2006.01) |
| H01L 27/24 | (2006.01) |

(52) U.S. Cl.
CPC ....... *H01L 23/535* (2013.01); *H01L 21/76895* (2013.01); *H01L 27/1157* (2013.01); *H01L 27/11548* (2013.01); *H01L 27/11556* (2013.01); *H01L 27/11573* (2013.01); *H01L 27/11575* (2013.01); *H01L 27/11578* (2013.01); *H01L 27/11582* (2013.01); *H01L 27/2481* (2013.01); *H01L 27/249* (2013.01); *H01L 2924/0002* (2013.01)

(58) Field of Classification Search
CPC ................. H01L 2924/0002; H01L 27/11582; H01L 2924/00; H01L 27/11556; H01L 27/11578; H01L 27/0688
USPC .................................. 257/5, 2, 314, E21.209
See application file for complete search history.

(56) References Cited

U.S. PATENT DOCUMENTS

| | | | |
|---|---|---|---|
| 8,187,932 B2 | 5/2012 | Nguyen et al. | |
| 8,394,716 B2 | 3/2013 | Hwang et al. | |
| 8,520,425 B2 | 8/2013 | Xiao et al. | |
| 2008/0149913 A1 | 6/2008 | Tanaka et al. | |
| 2009/0230449 A1 | 9/2009 | Sakaguchi et al. | |
| 2010/0090188 A1* | 4/2010 | Futatsuyama | H01L 27/0688 257/2 |
| 2010/0254191 A1 | 10/2010 | Son et al. | |
| 2011/0316063 A1* | 12/2011 | Tang | H01L 27/0688 257/314 |
| 2012/0195128 A1 | 8/2012 | Fujiwara et al. | |

(Continued)

FOREIGN PATENT DOCUMENTS

| | | |
|---|---|---|
| KR | 20100109745 A | 10/2010 |
| KR | 20110021444 A | 3/2011 |

OTHER PUBLICATIONS

International Search Report for PCT/US2014/071397, dated Mar. 18, 2015 (5 pages).
Written Opinion of the International Searching Authority for PCT/US2014/071397, dated Mar. 18, 2015 (11 pages).
Invitation to Pay Additional Fees and Search Report from the European Patent Office received in connection with International Application No. PCT/US2014/071397; dtd Mar. 26, 2015.

(Continued)

*Primary Examiner* — David Vu
*Assistant Examiner* — Jonathan Han
(74) *Attorney, Agent, or Firm* — The Marbury Law Group PLLC

(57) ABSTRACT

A multi-level device includes at least one device region and at least one contact region. The contact region has a stack of alternating plurality of electrically conductive layers and plurality of electrically insulating layers located over a substrate. The plurality of electrically conductive layers form a stepped pattern in the contact region, where each respective electrically insulating layer includes a sidewall and a respective underlying electrically conductive layer in the stack extends laterally beyond the sidewall.

31 Claims, 18 Drawing Sheets

(56) References Cited

U.S. PATENT DOCUMENTS

2012/0256247 A1    10/2012  Alsmeier
2013/0130468 A1*   5/2013   Higashitani ......... H01L 29/7926
                                                          438/382
2013/0181184 A1*   7/2013   Sakuma .......... H01L 21/823431
                                                          257/5
2013/0270714 A1*   10/2013  Lee ................. H01L 21/76802
                                                          257/774

OTHER PUBLICATIONS

Non-Final Office Action for corresponding U.S. Appl. No. 14/643,211, filed Mar. 10, 2015, dated Apr. 4, 2016, containing 22 pages.
International Preliminary Report on Patentability for International Application No. PCT/US2014/071397, 12 pages, dated Jun. 21, 2016.

\* cited by examiner

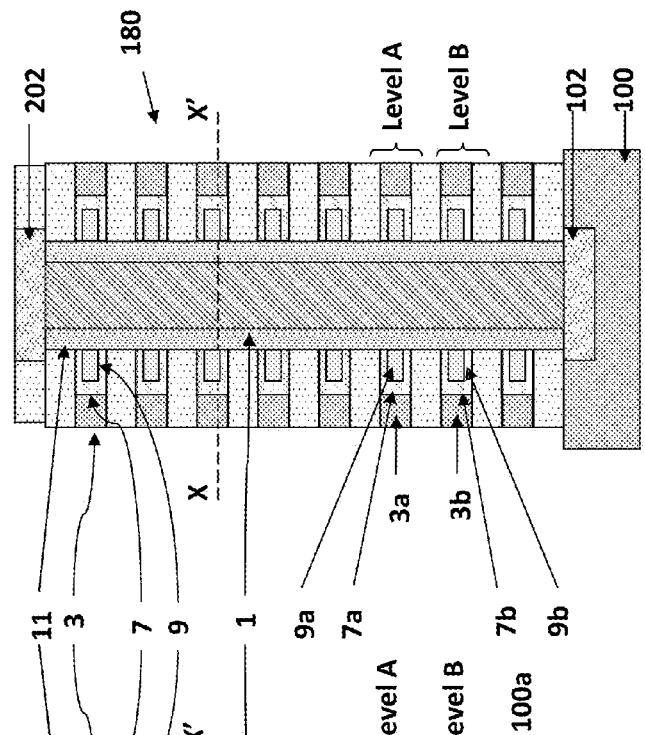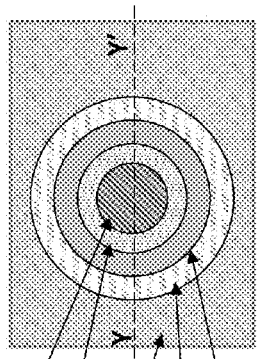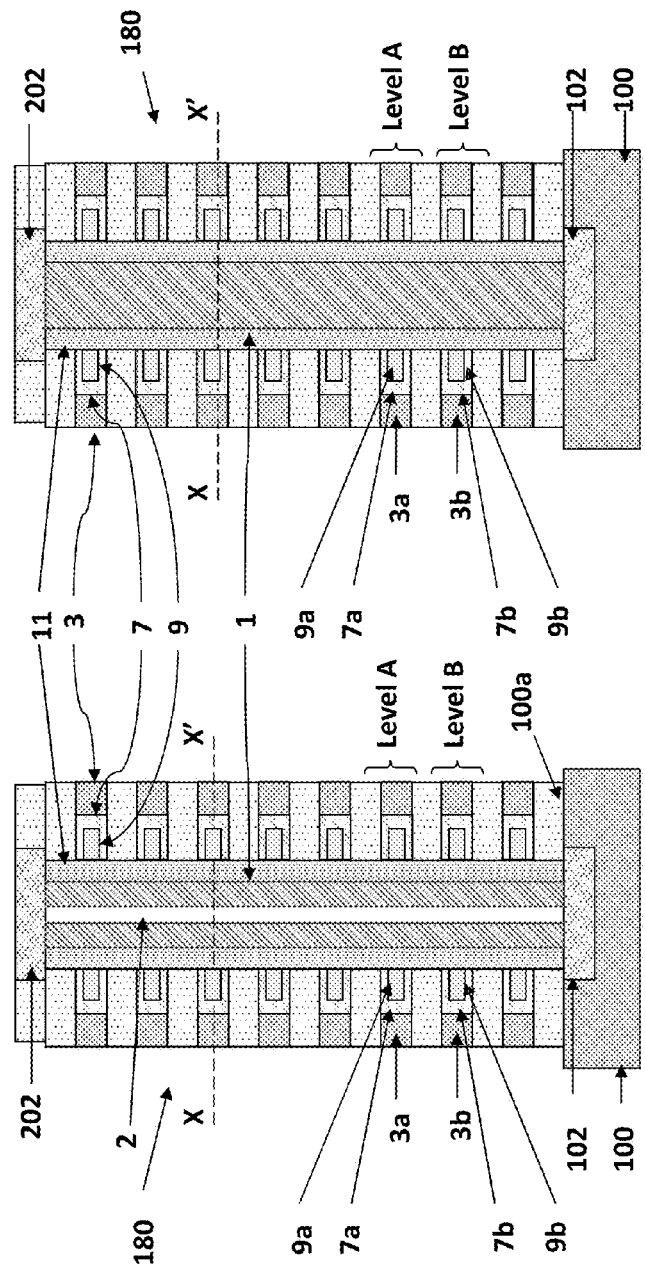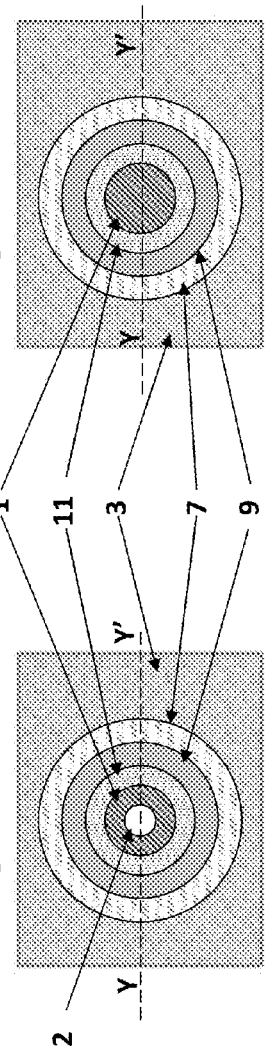

US 9,449,924 B2

MULTILEVEL CONTACT TO A 3D MEMORY ARRAY AND METHOD OF MAKING THEREOF

FIELD

The present invention relates generally to the field of semiconductor devices and specifically to three dimensional vertical NAND strings and other three dimensional devices and methods of making thereof.

BACKGROUND

Three dimensional ("3D") vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process, which results in a roughly conical active region shape.

SUMMARY

One embodiment relates to a multilevel device. The device includes at least one device region and at least one contact region. The contact region has a stack of alternating plurality of electrically conductive layers and plurality of electrically insulating layers located over a substrate. The plurality of electrically conductive layers form a stepped pattern in the contact region, where each respective electrically insulating layer includes a sidewall and a respective underlying electrically conductive layer in the stack extends laterally beyond the sidewall. A respective electrically conductive sidewall spacer of a plurality of electrically conductive sidewall spacers is located adjacent to the sidewall of each electrically insulating layer, where the sidewall spacer is in electrical contact with the electrically conductive layer underlying the respective electrically insulating layer and is substantially electrically isolated from the other electrically conductive layers in the plurality of electrically conductive layers in the stack.

Another embodiment relates to a method of making multi-level contacts, including the following steps. Step (a) includes providing an in-process multilevel device comprising at least one device region and at least one contact region located over a substrate, the contact region including a stack of a plurality of alternating electrically insulating layers and electrically conductive layers, each respective electrically insulating layer located on the respective electrically conductive layer to isolate the respective electrically conductive layer from any overlaying electrically conductive layers in the stack. Step (b) includes forming a mask over a portion of the stack in the contact region. Step (c) includes removing a portion of an upper most first electrically insulating later in the stack that is not covered by the mask layer to expose a portion of an underlying first electrically conductive layer in such that the exposed portion of the underlying first electrically conductive layer extends laterally past a first sidewall formed in the uppermost first electrically insulating layer. Step (d) includes forming a first conformal layer of electrically conductive material on the first sidewall and on the exposed portion of underlying first electrically conductive layer in the stack. Step (e) includes etching the device to form a first electrically conductive sidewall spacer adjacent to the first sidewall and to expose a portion of a second electrically insulating layer under the first electrically conductive layer, wherein the exposed portion extends laterally past the first electrically conductive sidewall spacer.

In various embodiments, the device region may include any suitable multilayer device including, for example, a non-volatile memory device such as a vertical NAND memory device or a vertical restive random access memory (ReRAM) device.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIG. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

DETAILED DESCRIPTION

Embodiments of the present invention will be described below with reference to the accompanying drawings. It should be understood that the following description is intended to describe exemplary embodiments of the invention, and not to limit the invention.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Embodiments of the invention relate to methods of making contacts to a multilevel memory array, such as a monolithic 3D array. In an embodiment, the multi-level memory device includes at least one device region in which the memory cells (e.g., vertical NAND strings 180 or ReRAM memory cells) are located and at least one contact region in which the multi-level contacts are located. As illustrated in FIGS. 5A and 5B and discussed in more detail below, the distal ends of the electrodes of a ReRAM memory array (e.g., the word lines WL of the ReRAM device of FIG. 4) or control gates of a multi-level vertical NAND memory array are arranged in a step-by-step configuration (stepped pattern). In this manner, electrical contact to the individual control gates or electrodes can be achieved by etching an array of openings 130A-130E in the surrounding dielectric layer(s) from the top surface of the memory array down to the steps 120 and depositing contact metal 132 in the openings 130A-130E to contact the steps 120. In conventional methods of fabricating the contacts, the more shallow steps may be heavily over-etched before the deepest steps are exposed.

Other embodiments of the invention provide a monolithic, three dimensional array of memory devices, such as an array of vertical NAND strings or ReRAM devices. The memory cells of such devices may be vertically oriented, such that at least one memory cell is located over another memory cell. The array allows vertical scaling of the devices to provide a higher density of memory cells per unit area of silicon or other semiconductor material.

Figure 4:
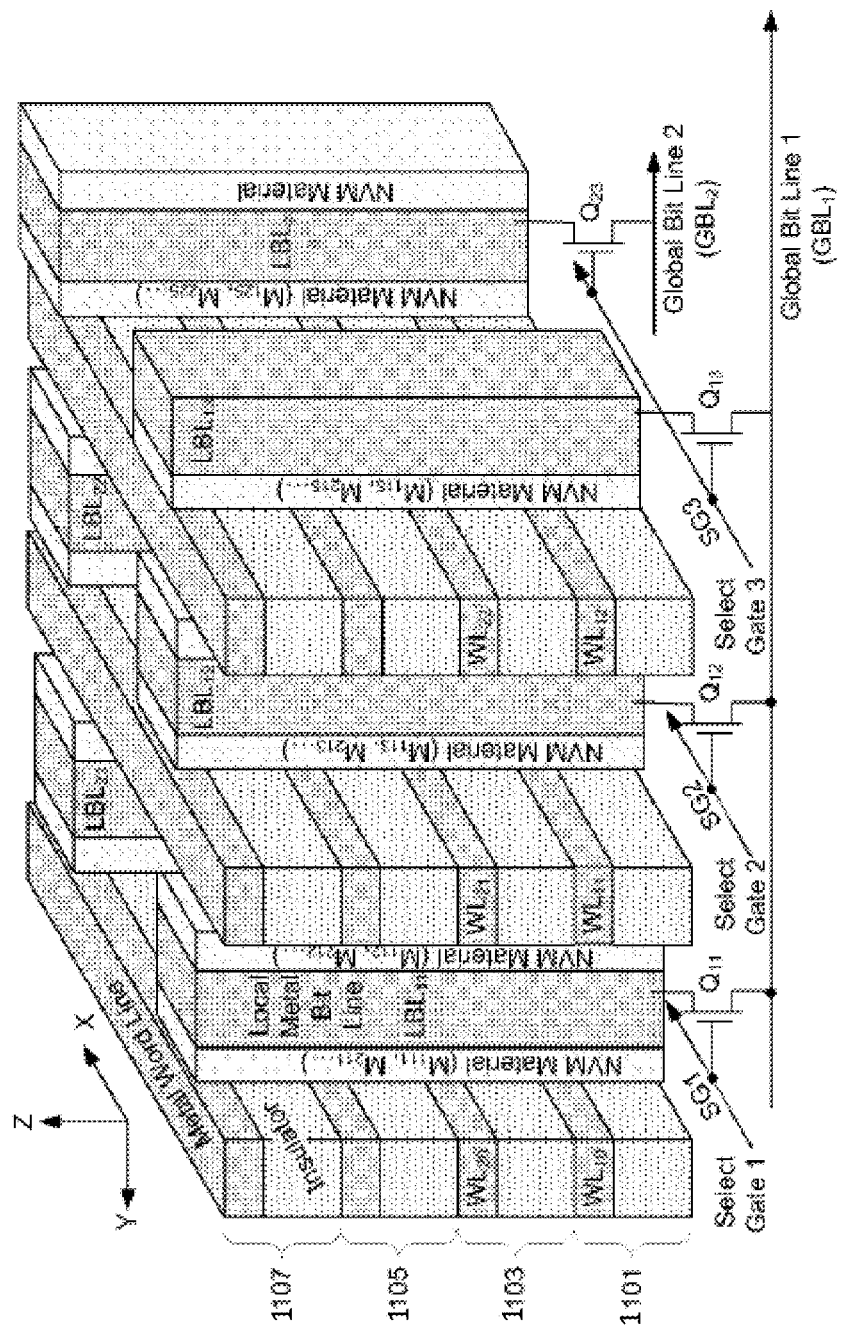
FIG. 4 is a schematic illustration of a vertical bit line ReRAM memory device of another embodiment.
Figure 5A:
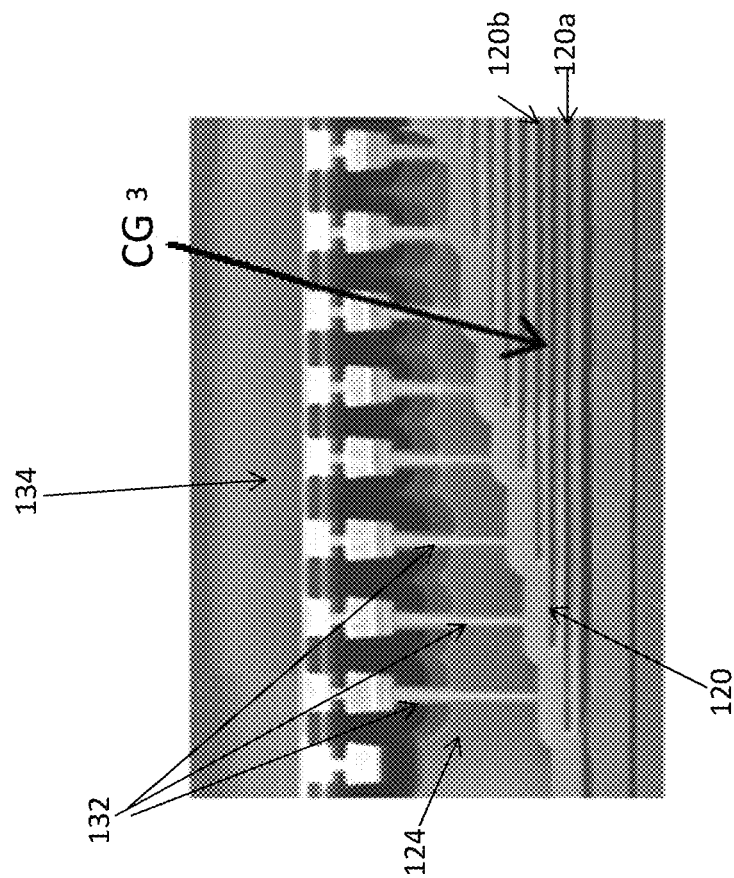
FIG. 5A is a scanning electron microscope (SEM) image of a cross-section of a conventional NAND string memory device showing the contacts to the control gate electrodes (e.g., word lines).
Figure 5B:
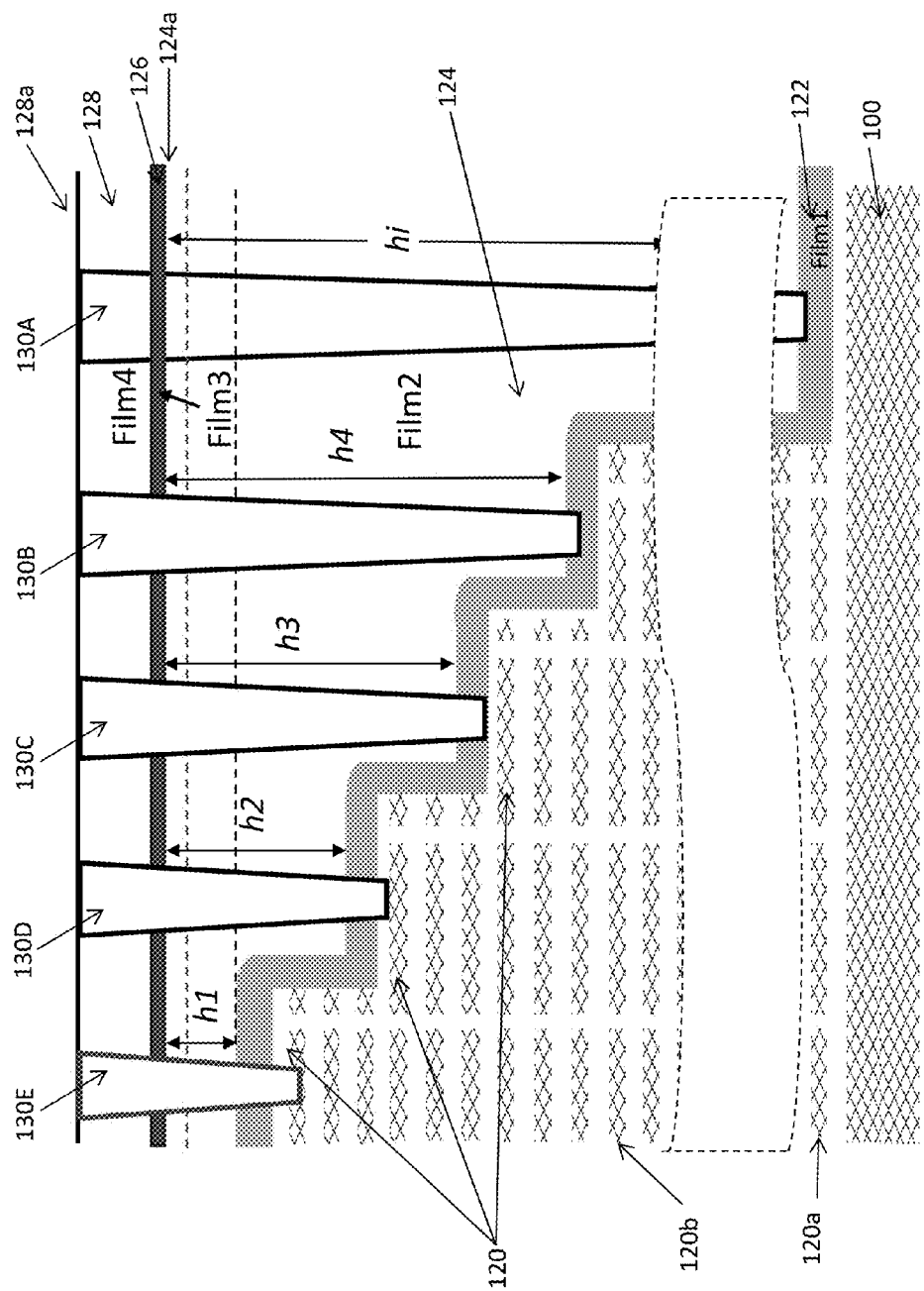
FIG. 5B is a schematic illustration of a conventional method of making a multi-level contact.

Referring to FIG. 4, one example semiconductor structure for implementing a vertically oriented 3D ReRAM memory element array is illustrated, of the type described in U.S. Pat. Pub. No. 2012/0147648, published Jun. 14, 2012. The ReRAM device is configured for use of non-volatile memory element (NVM) material that is non-conductive when first deposited. Since the material is initially non-conductive, there is no necessity to isolate the memory elements at the cross-points of the word and bit lines from each other. Several memory elements may be implemented by a single continuous layer of material, which in the case of FIG. 4 are strips of NVM material oriented vertically along opposite sides of the vertical bit lines in the y-direction and extending upwards through all the planes. A significant advantage of the structure of FIG. 4 is that all word lines and strips of insulation under them in a group of planes may be defined simultaneously by use of a single mask, thus greatly simplifying the manufacturing process.

Referring to FIG. 4, a small part of four planes 1101, 1103, 1105 and 1107 of the three-dimensional array are shown. All of the planes have the same horizontal pattern of conductor, dielectric and NVM material. In each plane, electrically conductive (e.g., metal) word lines ($WL_{zy}$) are elongated in the x-direction and spaced apart in the y-direction. Each plane includes a layer of insulating material (e.g., a dielectric) that isolates its word lines from the word lines of the plane below it or, in the case of plane 1101, of the substrate circuit components below it. In some embodiments, the word lines $WL_{zy}$ for a fixed value of y form a stack of alternating layers that may extend beyond the memory device into a contact area. For example, in some embodiments, a portion of such a stack of extended word lines and alternating dielectric layers may form layer stack 301 in the in the contact area 300 as shown in FIGS. 6, 7A-7K, and 8 (discussed in greater detail below).

Extending through each plane is a collection of electrically conductive (e.g., metal) local bit line (LBL) "pillars" elongated in the vertical z-direction and forming a regular array in the x-y direction.

Each bit line pillar is connected to one of a set of underlying global bit lines (GBL) (e.g., located in the silicon substrate) running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry. In the case of using npn transistors instead of MOS transistors, the row select line (SG) lines are replaced with the base contact electrode lines elongated in the x-direction. Also fabricated in the substrate but not shown in FIG. 4 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

Figure 3:
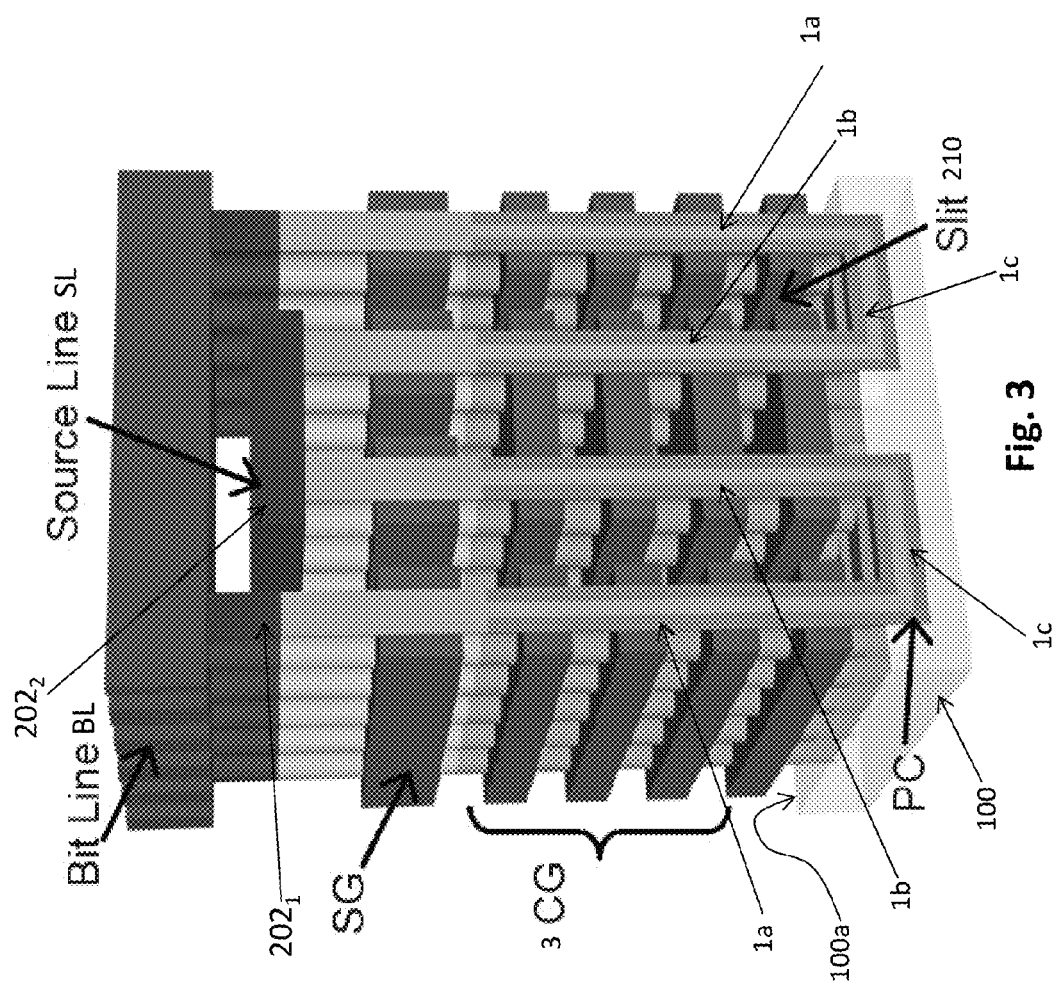
FIG. 3 is a schematic illustration of a NAND string memory device of another embodiment.

Referring back to FIGS. 1A-2B, in some embodiments, the monolithic three dimensional NAND string 180 comprises a semiconductor channel 1 having at least one end portion extending substantially perpendicular to a major surface 100a of a substrate 100, as shown in FIGS. 1A, 2A, and 3. For example, the semiconductor channel 1 may have a pillar shape and the entire pillar-shaped semiconductor channel extends substantially perpendicularly to the major surface 100a of the substrate 100, as shown in FIGS. 1A and 2A. In these embodiments, the source/drain electrodes of the device can include a lower electrode 102 provided below the semiconductor channel 1 and an upper electrode 202 formed over the semiconductor channel 1, as shown in FIGS. 1A and 2A. Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain regions $202_1$ contacts the first wing portion of the semiconductor channel from above, and another one of a source or drain regions $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select gate (SG) or access transistors are shown in FIG. 3. In an embodiment as illustrated in FIG. 3, the source regions $202_2$ of adjacent NAND strings may be connect via a source line SL, while the drain regions $202_1$ of adjacent NAND strings may be connect via a bit line BL. In the U-shaped embodiment, a slit 210 separates the two wing portions 1a and 1b of the U-shaped pipe shape. The slit 210 maybe filled with a dielectric material.

In some embodiments, the semiconductor channel 1 may be a filled feature, as shown in FIGS. 2A-2B. In some other embodiments, the semiconductor channel 1 may be hollow, for example a hollow cylinder filled with an insulating fill material 2, as shown in FIGS. 1A-1B. In these embodiments, and an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, and 3. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

A blocking dielectric 7 is located adjacent to and may be surrounded by the control gate(s) 3. The blocking dielectric 7 may comprise a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 1A-1B and 2A-2B. Alternatively, the blocking dielectric 7 may be continuous as shown in FIG. 3.

The monolithic three dimensional NAND string may also comprise a plurality of discrete charge storage segments 9, each of which is located between the blocking dielectric segments 7 and the channel 1. Similarly, the plurality of discrete charge storage segments 9 comprise at least a first discrete charge storage segment 9a located in the device level A and a second discrete charge storage segment 9b located in the device level B. Alternatively, the charge storage segment(s) 9 may be continuous as shown in FIG. 3. That is, the charge storage segments may comprise localized regions in a continuous charge storage layer.

The tunnel dielectric 11 of the monolithic three dimensional NAND string is located between each one of the plurality of the discrete charge storage segments 9 and the semiconductor channel 1. The tunnel dielectric 11 may comprise a plurality of blocking dielectric segments 11 or a continuous layer of dielectric material.

The blocking dielectric 7 and the tunnel dielectric 11 may be independently selected from any one or more same or different electrically insulating materials, such as silicon oxide, silicon nitride, silicon oxynitride, or other high-k insulating materials.

The charge storage segment(s) 9 may comprise a discrete or continuous conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete or continuous charge storage dielectric (e.g., silicon nitride or another dielectric) feature. For example, in some embodiments, the discrete charge storage segments 9 are discrete charge storage dielectric features, each of which comprises a nitride feature located in the respective clam-shaped blocking dielectric segment 7, where the silicon oxide blocking dielectric segment 7, the nitride feature 9 and the silicon oxide tunnel dielectric 11 form oxide-nitride-oxide discrete charge storage structures of the NAND string. Alternatively, a polysilicon floating gate may be used.

FIG. 5A is a scanning electron microscope (SEM) image that illustrates a cross-section of a vertical NAND memory device. As illustrated in FIG. 5A, the contacts 132 extend from a top surface of a contact region 134 to the gate electrode steps 120 (e.g., a stepped word line pattern) of the control gates 3. As discussed in more detail below, the contacts 132 are made by filling vias formed in an electrically insulating (dielectric) material 124 with an electrically conducting material, such as tungsten, TiN, copper or aluminum or their alloys or silicides. To form the stepped pattern illustrated in FIG. 5A, the control gate electrodes 3 are configured such that a first conductive layer (e.g., a lower layer in the stack of layers) includes a portion that laterally extends past a second conductive layer (e.g., a higher layer in the stack). The contact openings include a first contact opening (e.g., 130A, in FIG. 5B) that extends to the first portion of the first conductive layer (e.g., 120a) and a second contact opening (e.g., 130B in FIG. 5B) extends to an upper surface of the second conductive layer (e.g., 120b). For example, the first conductive layer (e.g., 120a) may be a portion of a first control gate electrode 3 which extends from the device region to the contact region 134 and the second conductive layer (e.g., 120b) may be a portion of a second control gate electrode 3 which extends from the device region to the contact region 134.

FIG. 5B illustrates the problem of shallow side over etching with the conventional method of making the multi-level contact of FIG. 5A discussed above. In the conventional method, the control gate steps 120 are covered with a stack of layers of dielectric (electrically insulating) materials. The first dielectric layer is a conformal etch stop layer 122. The conformal etch stop layer 122 may be made of any suitable material, such as silicon nitride. The conformal etch stop layer 122 is covered with a second dielectric layer 124, made of a different material than layer 122. The second dielectric material may be made of any suitable material including oxides, such as silicon oxide (e.g., $SiO_2$). The second dielectric layer 124 is not conformal. That is, the thickness (h1, h2, h3, h4 . . . hi) of the dielectric layer 124 varies over each step 120 such the upper surface 124a of the second dielectric layer 124 is the same distance from the substrate 100 over all of the steps 120. A third dielectric layer, sacrificial barrier layer 126, is deposited over the second dielectric layer 124. The sacrificial barrier layer 126 may be made of any suitable material, such as silicon nitride (e.g., preferably the same material as conformal etch stop layer 122 but a different from material the second dielectric layer 124). A fourth dielectric layer 128 is then deposited over the sacrificial barrier layer 126. The fourth dielectric layer 128 may be made of any suitable material including oxides, such as silicon oxide, (e.g., $SiO_2$).

To make the contacts to the control gate steps 120, openings 130A-130E are etched from the top surface 128a of the fourth dielectric layer 128 through the fourth dielectric layer 128, the sacrificial barrier layer 126 and the second dielectric layer 124. Typically, the fourth dielectric layer 128 and the sacrificial barrier layer 126 are non-selectively etched (i.e., etched with an etchant that etches all materials at essentially the same rate) in a first etching step. Then the second dielectric layer 124 is selectively etched (i.e., etched with an etchant that etches one material (e.g. the second dielectric material 124) substantially faster (e.g., 2-10× or more faster) than the underlying material (e.g., etch stop layer 122)) so that the openings stop on the etch stop layer 122.

However, when etching the openings 130A-130E, it is not uncommon that the shallower openings (e.g., 130E, 130D, 130C) will penetrate the etch stop layer 122 prior to the longer openings (e.g. 130A) reaching the etch stop layer 122. This especially problematic as the number of levels (steps) increases. The number of levels in a multilevel memory device, such as a multi-level NAND device, is unlimited and may include, for example, 2-256 levels, such as 4-128 levels such as, 8-64 levels, such as 16-32 levels. The contacts are completed by depositing an electrically conducting material, such as Cu, Al, their alloys or a silicide (e.g., Ti, Ni or Co silicide) into the openings 130A-130E.

Figure 6:
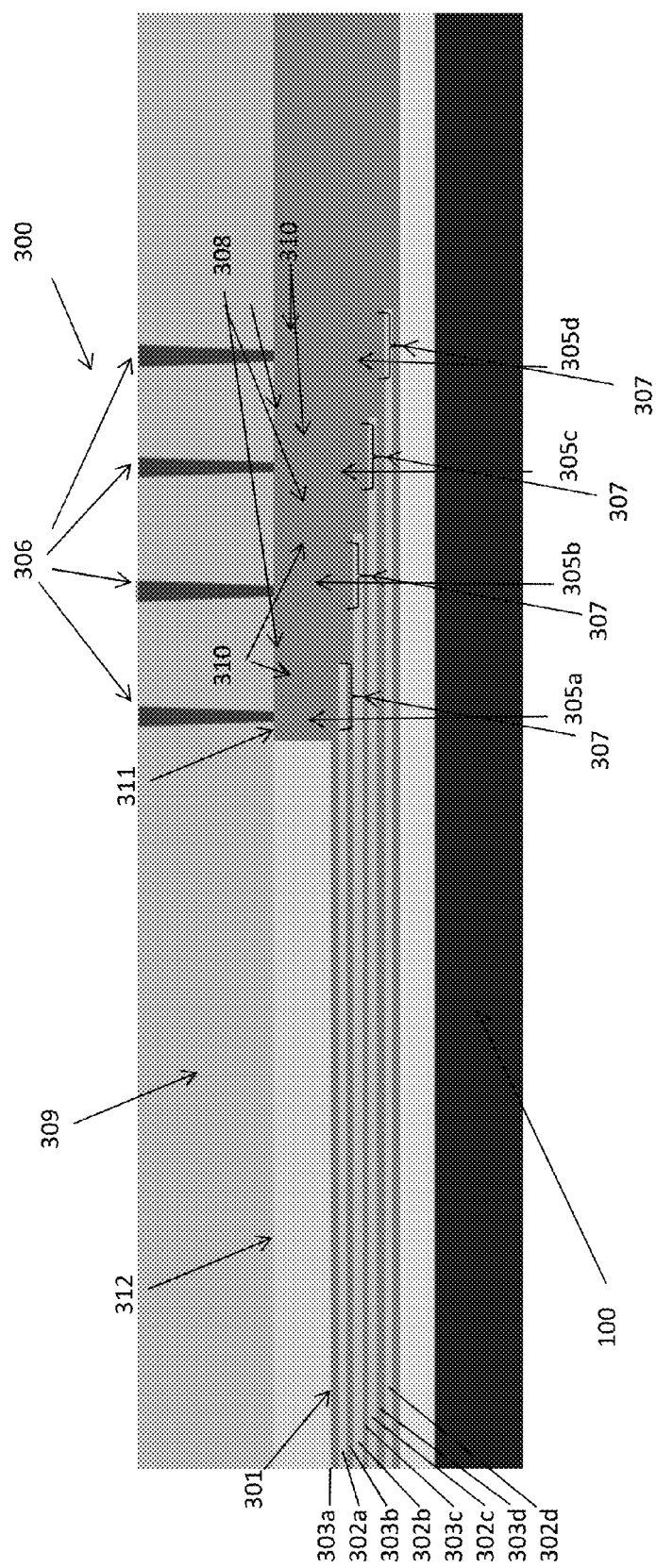
FIG. 6 is a schematic illustration of a multi-level contact according to an embodiment.

FIG. 6 is a schematic illustration of a first embodiment of a multi-level contact in a device. In some embodiments, the multi-level contact advantageously avoids some or all of the difficulties described above with respect to conventional contact techniques.

The device includes at least one device region (not shown) and at least one contact region 300. The contact region 300 has a stack 301 of an alternating plurality of electrically conductive layers 302a, 302b, 302c and 302d and plurality of electrically insulating layers 303a, 303b, 303c, and 303d located over a substrate 100. Although a stack 301 having four conductive layers is shown, in other embodiments any suitable number of conductive layers may be used, e.g., 2, 3, 4, 5, 6, 7, 8, or more layers. Some embodiments may include 2-256 layers, such as 4-128 layers, such as, 8-64 layers, such as 16-32 layers, In some embodiments, the conductive layers 302a, 302b, 302c and 302d extend past the left side of the illustration, to provide electrical connections to respective levels in a multi-level device in the device region (e.g., underlaying insulating layer 312 outside of the contact region 300). For example, in some embodiments the conductive layers 302a-302d may comprise or be in electrical contact with word lines (e.g., control gates) of a NAND device or the electrodes (e.g., word lines) of a ReRAM device.

The plurality of electrically conductive layers 302a-302d form a stepped pattern in the contact region. Each respective electrically insulating layer of the layers 303a-303d includes a sidewall. For each insulating layer 303a-303d, a respective underlying electrically conductive layer 302a-302d in the stack 301 extends laterally beyond the sidewall. A respective electrically conductive sidewall spacer 305 is located adjacent to the sidewall of each electrically insulating layer 303a-303d. Each sidewall spacer 305a-305d is in electrical contact with the electrically conductive layer underlying the respective electrically insulating layer and is substantially electrically isolated from the other electrically conductive layers in the plurality of electrically conductive layers in the stack. For example, as show, the leftmost sidewall spacer 305a is in electrical contact only with the electrically conductive layer 302a, the second leftmost sidewall spacer 305b is in electrical contact with only electrically conductive layer 302b, and so forth.

In some embodiments, each of the sidewall spacers 305a-305d extends vertically past a set of the electrically conductive layers 302a-302d in the stack 301 which overlay the respective electrically insulating layer. In some embodiments, e.g., as shown, each of the plurality of sidewall spacers 305a-305d contacts a contact portion 307 of a respective one of the electrically conductive layers 302a-302d corresponding to the stepped pattern. The contact portion 307 extends laterally past any overlaying electrically conductive layers in the stack 301. This ensures that the top of each sidewall spacer 305 is clear of the stack 301 and available for contact with via connections 306, as described in detail below.

In some embodiments, an electrically insulating fill material 308 substantially fills a lateral space between each pair of laterally adjacent sidewall spacers (e.g., spacers 305a and 305b, spacers 305b and 305c, etc.). As shown, the electrically insulating fill material 308 in the contact region may have a flat top exposing tops of the sidewall spacers 305.

In some embodiments, an overlaying insulating layer 309 is formed over the contact region 300. Electrically conductive via connections 306 extend vertically through the overlaying insulating layer 309 to make electrical contact with the plurality of sidewall spacers 305a-305b. In some embodiments, each of the plurality of sidewall spacers 305a-305b extends laterally past the via connection 306 at a location where the via connection contacts the sidewall spacer 305a-305b. In some embodiments, each of the plurality of sidewall spacers 305 has a lateral cross sectional area that is greater than a lateral cross sectional area of the via connection 306 at the location 311 where the via connection 306 contacts the sidewall spacer 305. In some embodiments, each of the sidewall spacers 305a-305d has a lateral cross sectional area that is at least 1.5 times, such as at least 2 times, such as at least 3 times, such as at least 5 times the lateral cross sectional area of the via connection 306 at the location 311 where the via connection 306 contacts the sidewall spacer 305. In some embodiments, each of the sidewall spacers 305 has a lateral cross sectional area that is in the range of greater than 1 to 100 times the lateral cross sectional area of the via connection 306 at the location 311 where the via connection 306 contacts the sidewall spacer 305, or any sub-range thereof.

This configuration may be advantageous, as it may prevent loss of contact even in cases where the via connection 306 is misaligned with sidewall spacer 305 (e.g., due to errors during fabrication). That is, in some embodiments, the relatively wide top of the sidewall spacer presents a relatively large lateral target for the via connection. Similarly, because the sidewall spacers 305a-305d may be vertically thicker than the conductive layers 302a-302d, the risk of via over penetration through the sidewall spacer to an underlying conductive layer is reduced. For example, in some embodiments, each sidewall spacer 305 has a vertical thickness of at least 1.5 times, such as at least 2.0 times, such as at least 5.0 times, such as at least 10 times the thickness of the conductive layer it contacts. In some embodiments, each sidewall spacer 305 has a vertical thickness in the range of greater than 1 to 100 times the thickness of the respective conductive layer 302 it contacts, or any sub-range thereof.

Figure 8:
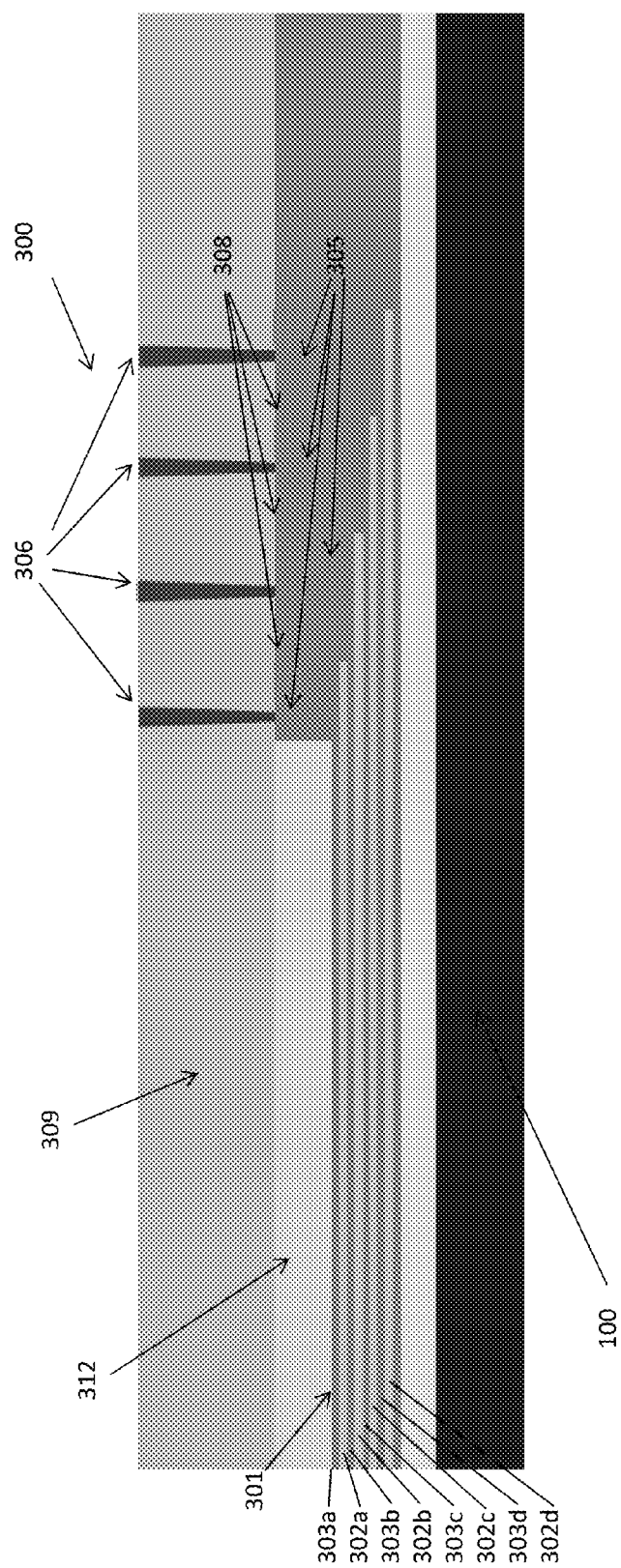
FIG. 8 is a schematic illustration of a method of making a multi-level contact according to an embodiment.

In the embodiments shown, each of the sidewall spacers 305 has a substantially L-shaped vertical cross section including an upper arm extending substantially vertically from a side of a substantially horizontal lower base arm. In some embodiments, a filler material 310 fills a space defined by the L-shaped vertical cross section between and adjacent to the upper arm and the lower base arm. This filler material may be of the same type or a different type from fill material 308. However, in some embodiments, this particular L-shape may be omitted for some or all of the sidewall spacers (e.g., as shown in FIG. 8 below).

As previously mentioned, the conductive layers 302a, 302b, 302c and 302d extend past the left side of the illustration, to provide electrical connections to respective levels in a multi-level device in the device region. In some embodiments the multi-level device is a memory device, such as a vertical NAND device or a ReRAM device.

For example, the multi-level device may be a NAND device such as the monolithic three dimensional NAND string 180 shown in FIGS. 1A-3B. Electrically conductive layers 302a-302d in the stack 301 may each include or are electrically connected to, e.g., a word line of the NAND device.

For example, in some embodiments, the NAND device may include a plurality of semiconductor channels (e.g., semiconductor channel 1 of NAND string 180), where at least one end portion of each of the plurality of semiconductor channels extends substantially perpendicular to a major surface of the substrate 100. The NAND device may include a plurality of charge storage regions, each charge storage region located adjacent to a respective one of the plurality of semiconductor channels (e.g., discrete charge storage segments 9 of the NAND string 180). The NAND device may also include a plurality of control gate electrodes (e.g., electrodes 3/302) having a strip shape extending substantially parallel to the major surface of the substrate, where the plurality of control gate electrodes include at least a first control gate electrode located in the first device level and a second control gate electrode located in the second device level (e.g., control gate electrodes 3a and 3b of the NAND string 180 shown in FIGS. 1B and 2B). In some embodiments, a first one (e.g., conductive layer 302a) of the plurality of electrically conductive layers 302a-302d in the stack 301 is in electrical contact with the first control gate electrode 3a and extends from the device region to the contact region 300 and a second one (e.g., conductive layer 302b) of the plurality of electrically conductive layers 302a-302d in the stack 301 is in electrical contact the second control gate electrode 3b and extends from the device region to the contact region 300.

As discussed above with reference to FIG. 4, in some embodiments, a ReRAM device may include one or more vertical stacks of word line electrodes $WL_{zy}$. In some embodiments, a first one (e.g., conductive layer 302a) of the plurality of electrically conductive layers 302a-302d in the stack 301 is in electrical contact with a world line electrode (e.g., $WL_{11}$) and extends from the device region to the contact region 300 and a second one (e.g., conductive layer 302b) of the plurality of electrically conductive layers 302a-302d in the stack 301 is in electrical contact the a second word line electrode (e.g., $WL_{21}$) and extends from the device region to the contact region 300.

FIGS. 7A-7K illustrate a method of making a multi-level contact in a device shown in FIG. 6.

Figure 7A:
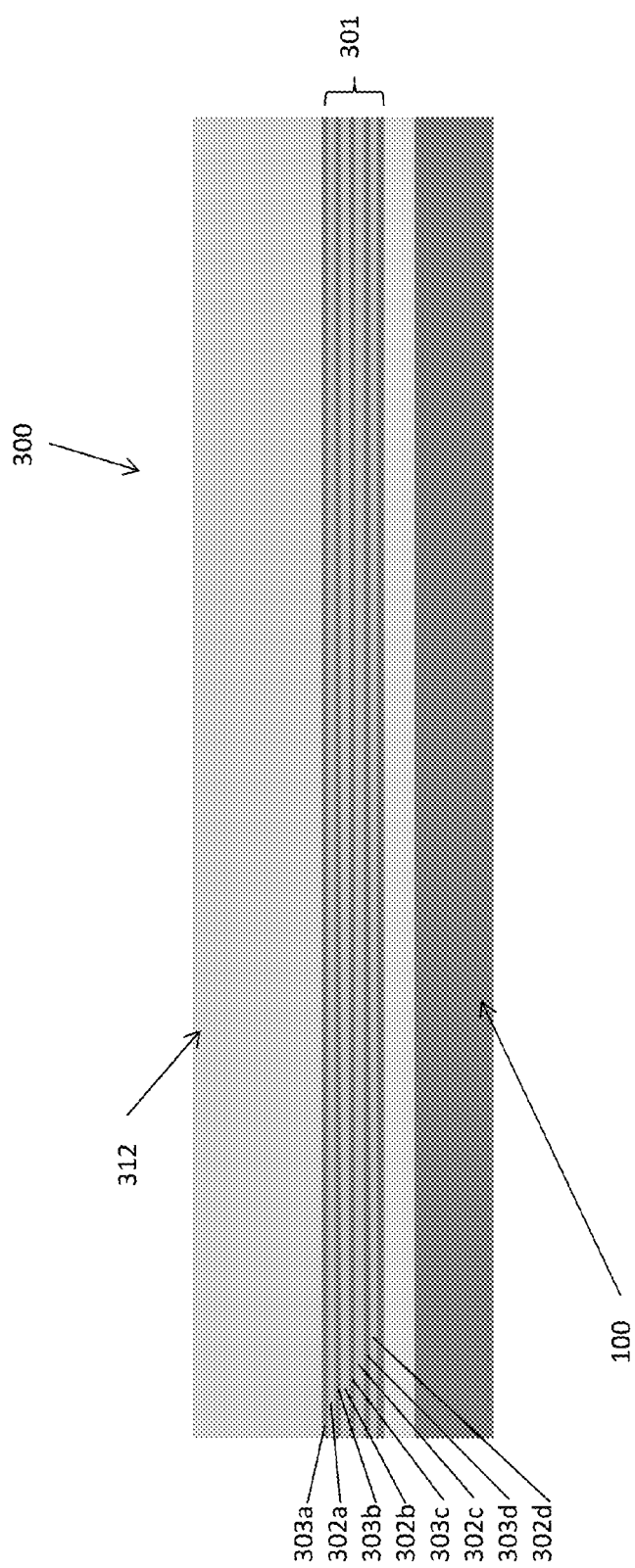
FIGS. 7A-7K are side cross sectional views of steps in the method making a multi-level contacts. For conciseness and clarity, the layers of layer stack 301 are explicitly labeled in FIG. 7A only.

As shown in FIG. 7A, an in-process multilevel device is provided including at least one device region (not shown) and at least one contact region 300 located over a substrate 100. The contact region includes a stack 301 of a plurality of alternating electrically insulating layers 303a-303d and electrically conductive layers 302a-302d. Each respective electrically insulating layer (e.g., 303d) is located on a respective electrically conductive layer (e.g., 302d) to isolate the respective electrically conductive layer from any overlaying electrically conductive layers in the stack (e.g., layers 302a-302d).

The conductive layers 302a-302d may be made from any suitable conductive material including a metal, a metal alloy, a metal silicide, or a highly doped semiconductor (e.g., W, $WSi_x$, WN, Ti, TiN, doped polysilicon, etc.). The insulating layers 303a-303d may be made from any suitable insulating material including, for example, an oxide (e.g., silicon oxide, $Al_2O_3$, $HfO_2$, etc.). Although four alternating layers are shown in stack 301, as noted above, any other suitable number may be used.

Figure 7B:
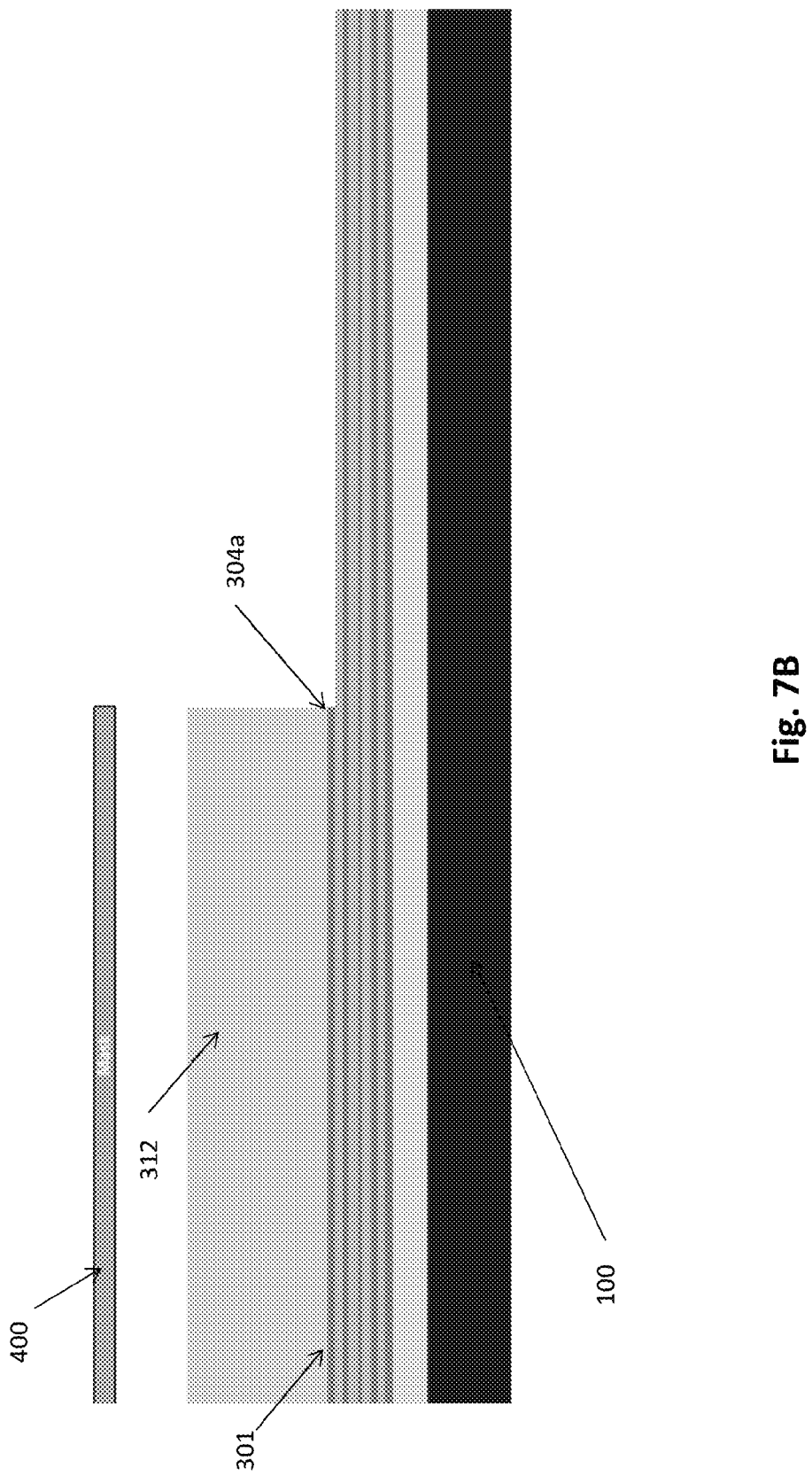

Referring to FIG. 7B, layer 312 (e.g., an insulating layer) may be optionally formed over the stack 301. A mask 400 is formed over a portion of layer 312 and over the stack 301 in the contact region 300. A portion layer 312 and of an upper most first electrically insulating layer 303a in the stack that is not covered by the mask layer 400 is removed (e.g., using any suitable etching process) to expose a portion of an underlying first electrically conductive layer 302a such that the exposed portion of the underlying first electrically conductive layer extends laterally past a first sidewall 304 formed in the uppermost first electrically insulating layer 303a.

In various embodiments, any suitable technique may be used to form the mask 400 including, e.g., photolithographic techniques. The mask 400 may include a photoresist material or a hard mask (e.g., C, SiN, $SiO_2$, a metal, etc).

Figure 7C:
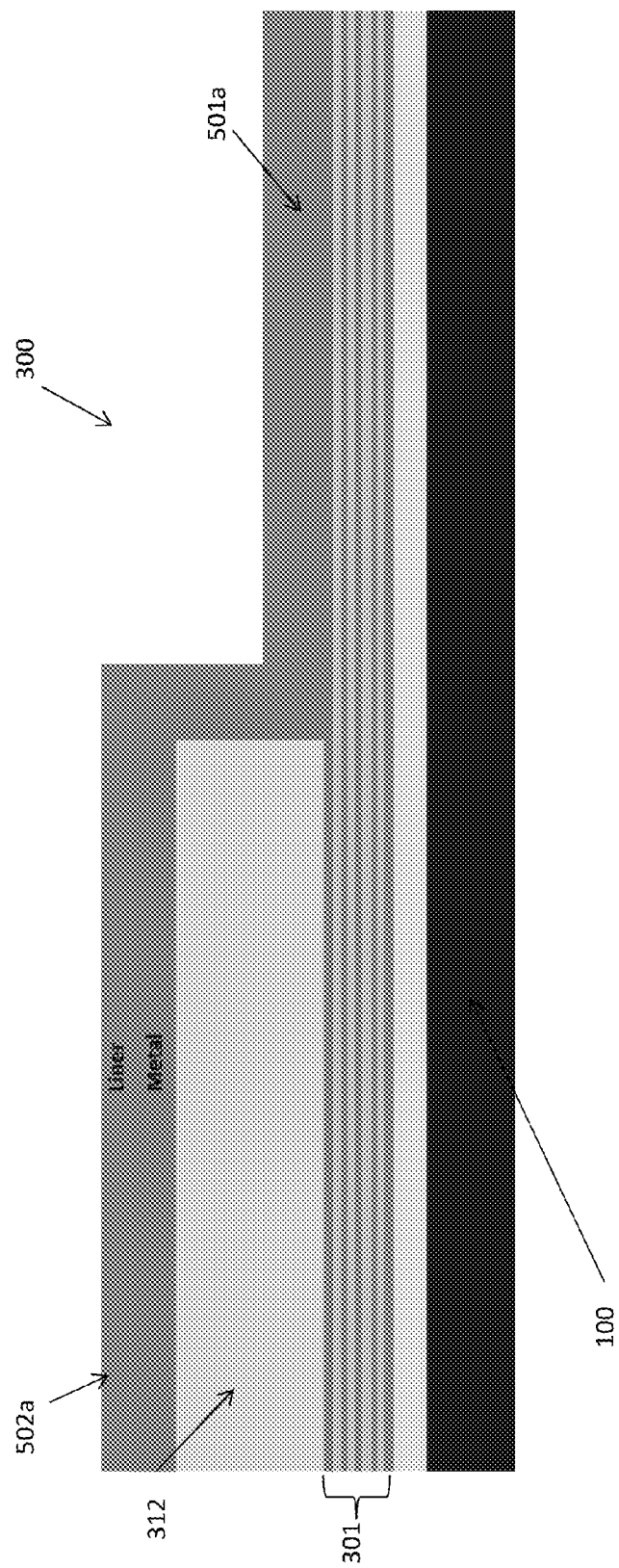

Referring to FIG. 7C a first conformal layer of electrically conductive material 501a on the first sidewall 304a and on the exposed portion of the underlying first electrically conductive layer 302a in the stack 301. The layer 501a may also be formed on the sidewall of the optional layer 312. Optionally, a first electrically insulating conformal liner layer may 502a be formed over the first conformal layer of electrically conductive material 501a. The liner layer 502a may be made from, for example, any suitable insulating material including, for example, an oxide (e.g., silicon oxide, $Al_2O_3$, $HfO_2$, etc.) or nitride (e.g., silicon nitride). As described below, use of the liner layer 502a will result in a finished structure of the type shown in FIG. 6 featuring sidewall spacers 305 having an L-shape. In contrast, omitting the liner layer 502a will result in a finished structure of the type shown in FIG. 8 featuring sidewall spacers 305 lacking an L-shape.

In various embodiments the layers 501a and or 502a may be formed using any suitable conformal deposition process including plating, chemical vapor deposition, physical vapor deposition, or atomic layer deposition.

Figure 7D:
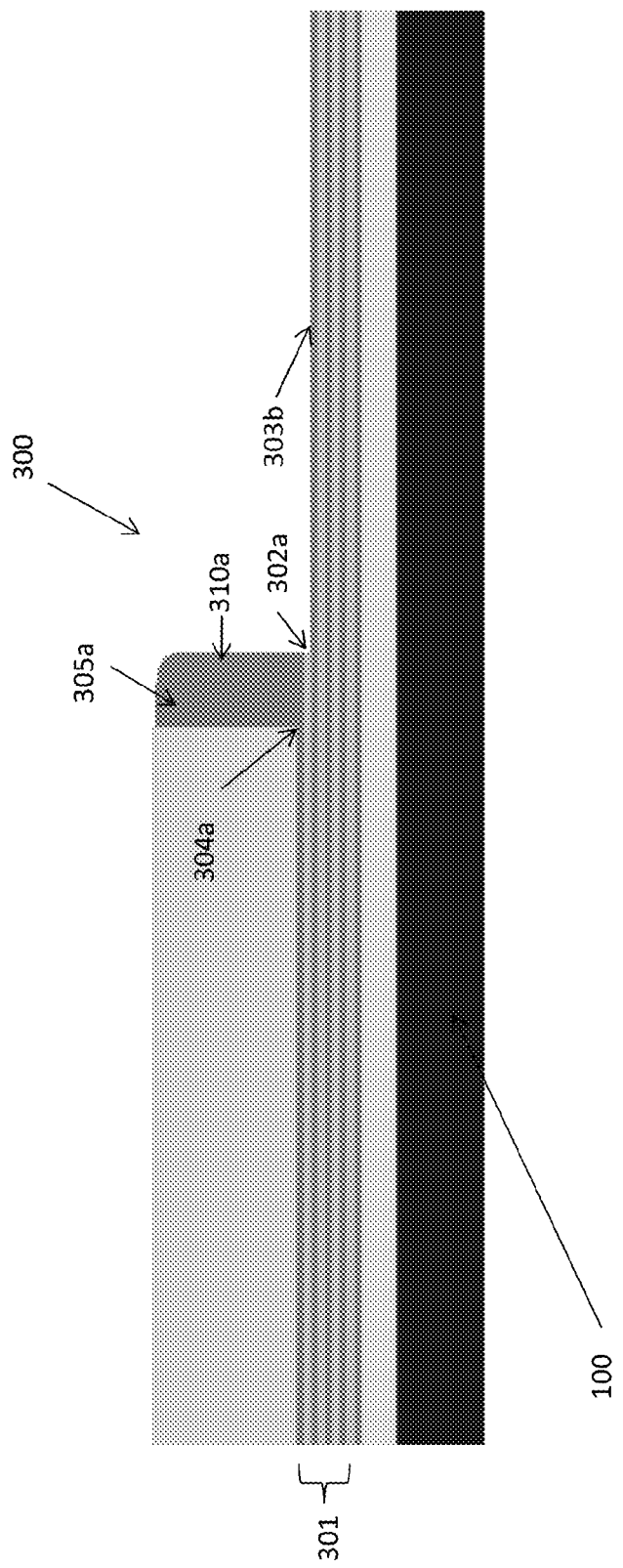

Referring to FIG. 7D, the device is etched to form a first electrically conductive sidewall spacer 305a adjacent to the first sidewall 304a and to expose a portion of a second electrically insulating layer 303b under the first electrically conductive layer 302a. The exposed portion extends laterally past the first electrically conductive sidewall spacer 305. Accordingly a step pattern begins to form in the contact region 300. In some embodiments, the first liner layer 502a may be etched to remove substantially all of the layer except for a first vertical spacer portion 310a in contact with the first electrically conductive sidewall spacer 305a.

Figure 7E:
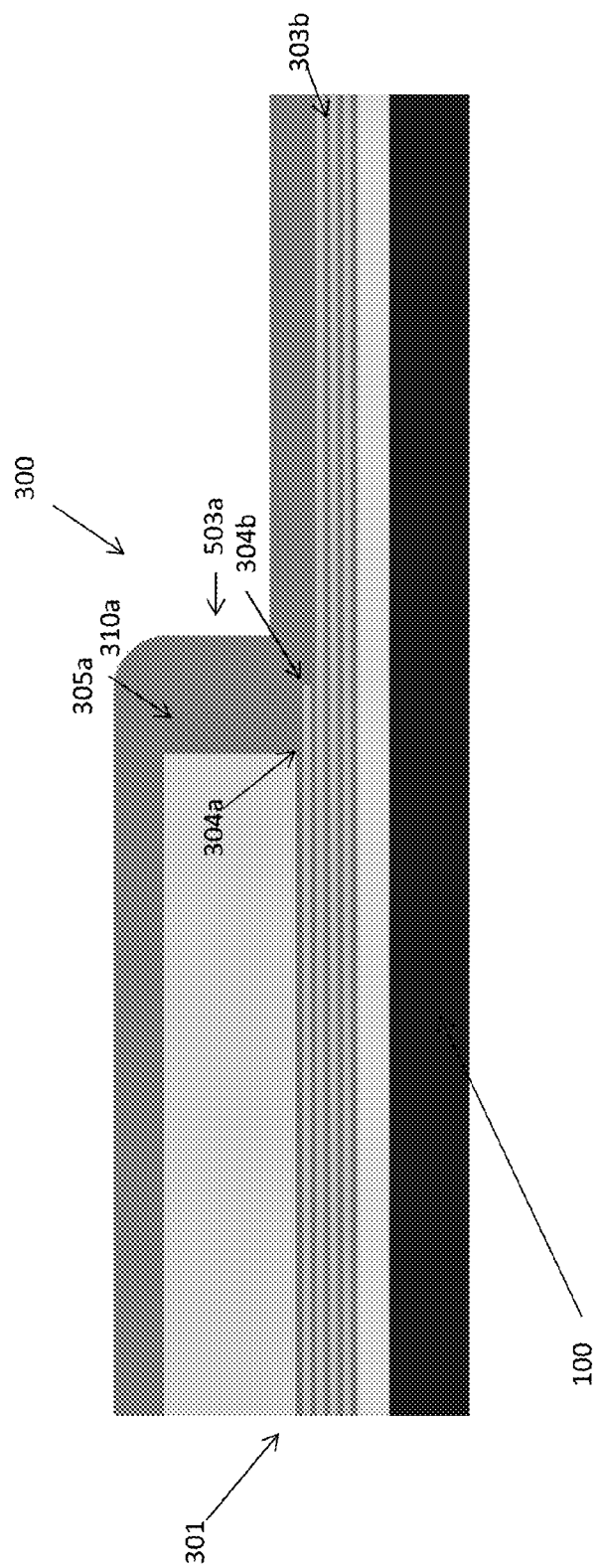

Referring to FIG. 7E, a first conformal insulating layer 503a of electrically insulating material over the first electrically conductive sidewall spacer 305a and the exposed portion (e.g., sidewall 304b) of the second electrically insulating layer 303b. In various embodiments the layer 503a may be formed using any suitable conformal deposition process including chemical vapor deposition, physical vapor deposition, or atomic layer deposition.

Figure 7F:
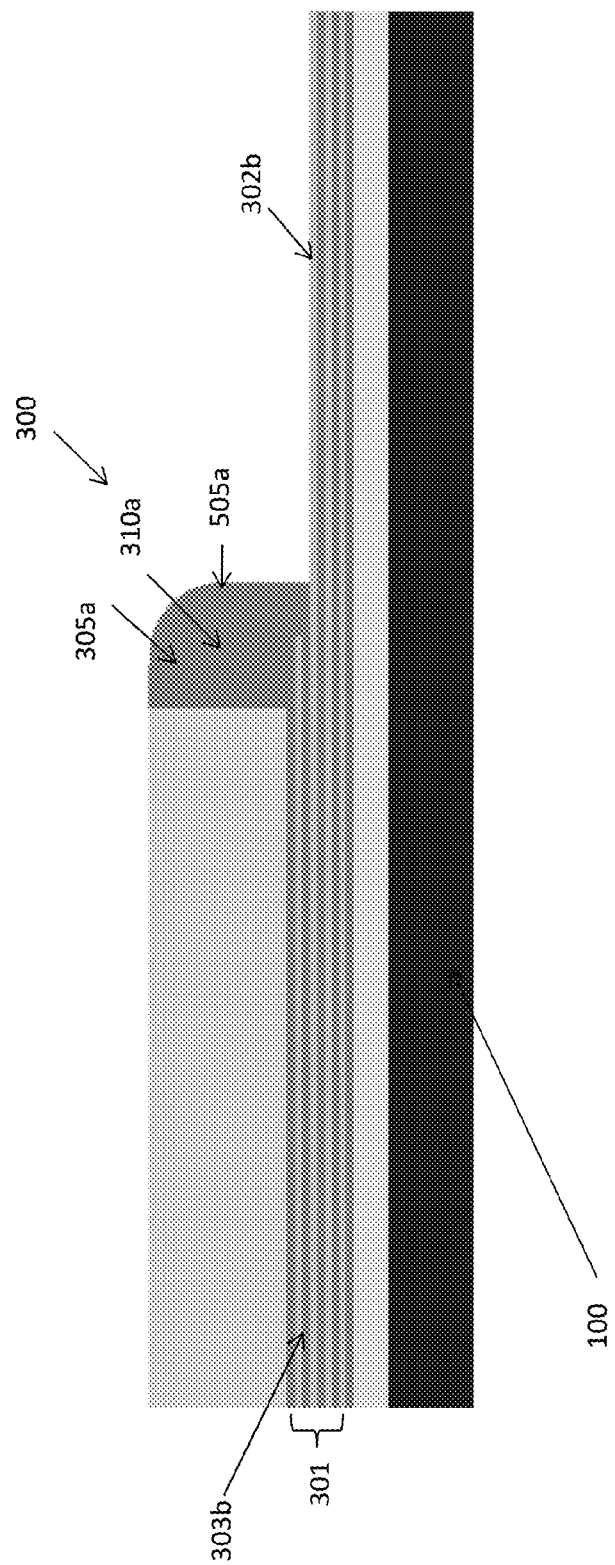

Referring to FIG. 7F, the device is etched to form a first electrically insulating sidewall spacer 505a adjacent to the first electrically conductive sidewall spacer 305a, and to expose a portion of a second electrically conductive layer 302b underlying the second electrically insulating layer 303b. In embodiments where a first liner layer 502a is used, the conductive sidewall spacer 305a and the removing substantially all of the first liner layer except for a first vertical spacer portion 310a are formed in the same step and the insulating sidewall spacer 510a is formed in a separate step.

Figure 7G:
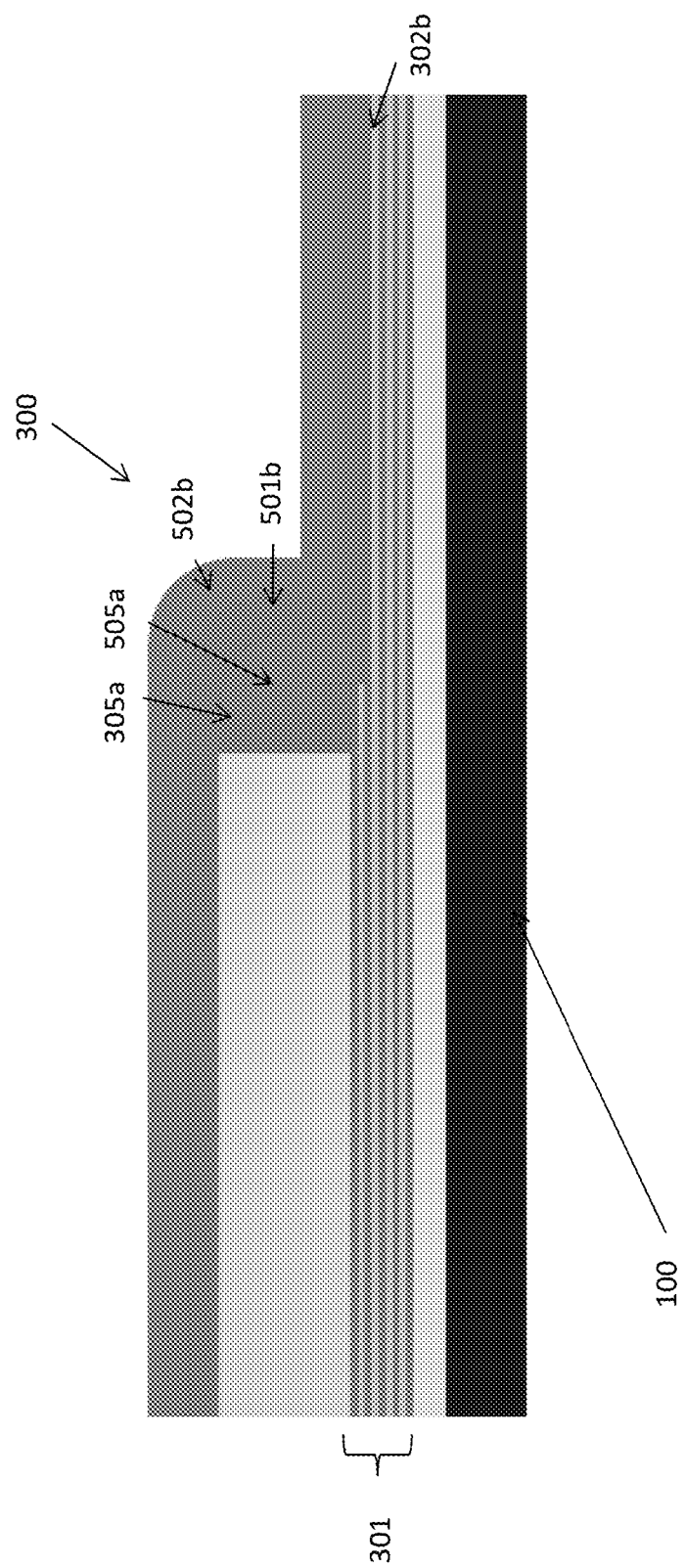

Referring to FIG. 7G, a second conformal layer of electrically conductive material 501b is formed over the electrically conductive sidewall spacer 305a, the electrically insulating sidewall spacer 505a, and the exposed portion of second electrically conductive layer 302b. Optionally, a second electrically insulating conformal liner 502b may be formed over the second conformal layer of electrically conductive material 501b.

Figure 7H:
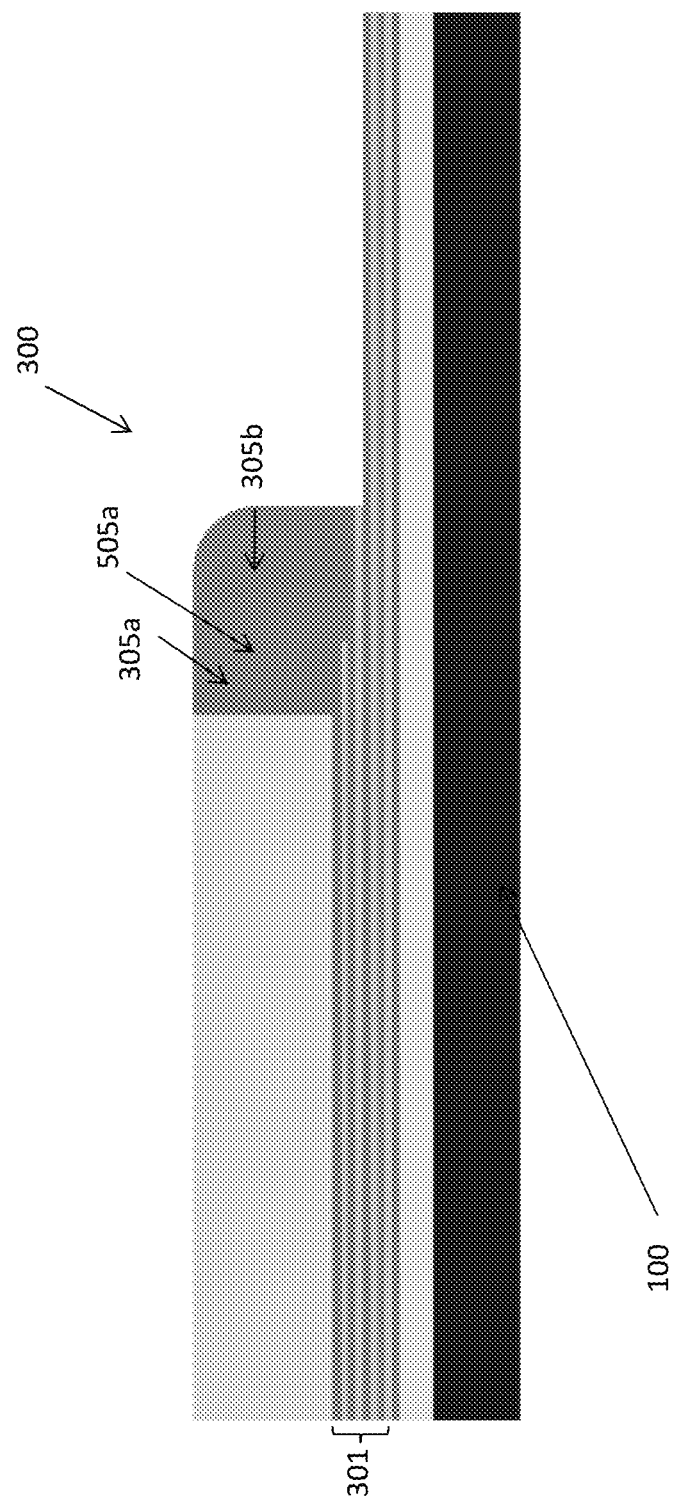

Referring to FIG. 7H, the device is etched to form another electrically conductive sidewall spacer 305b (and optional vertical filler 310b) adjacent to the electrically insulating sidewall spacer 505a. In the resulting structure, each electrically conductive sidewall spacer 305 is in electrical contact with only a respective one of the electrically conductive layers 302a-30d in the stack 301. As shown, the leftmost electrically conductive sidewall spacer 305a is in electrical contact with only electrically conductive layers 302a, while the rightmost electrically conductive sidewall spacer 305b is in electrical contact with only electrically conductive layers 302b.

Figure 7I:
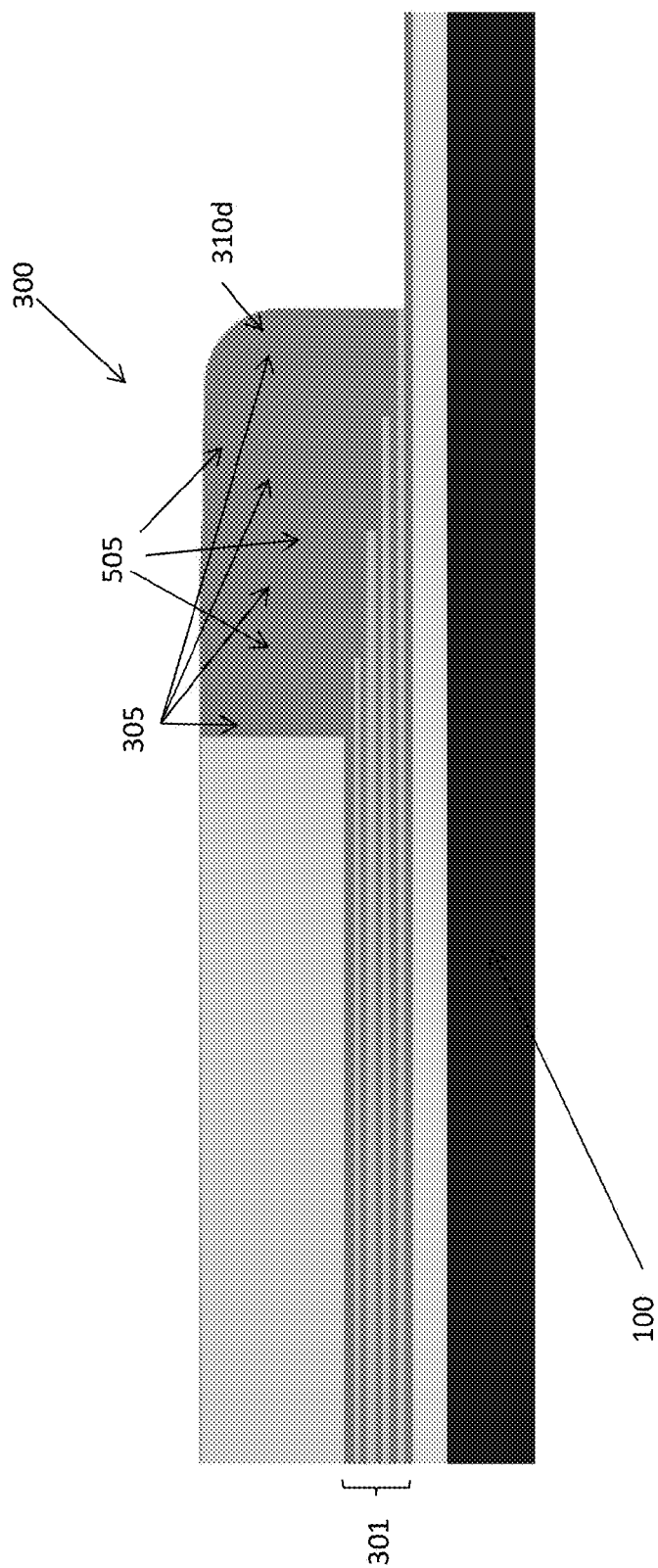

Referring to FIG. 7I, the process shown in FIGS. 7C-7G can be iteratively repeated to produce additional electrically conductive sidewall spacers 305c and 305d each in electrical contact with only a respective one of the electrically conductive layers 302a-302d in the stack 301. As shown, four electrically conductive sidewall spacers 305 are formed, corresponding to the four conductive layers 302a-302d in the stack 301. However, in other embodiments, any suitable number may be used. As shown four insulating spacers 505 and four optional vertical filler portions 310 are provided. However, in other embodiments, any suitable number may be used. Advantageously, in some embodiments, no additional masking steps (e.g., photolithographic masking) are required during this iterative process.

Figure 7J:
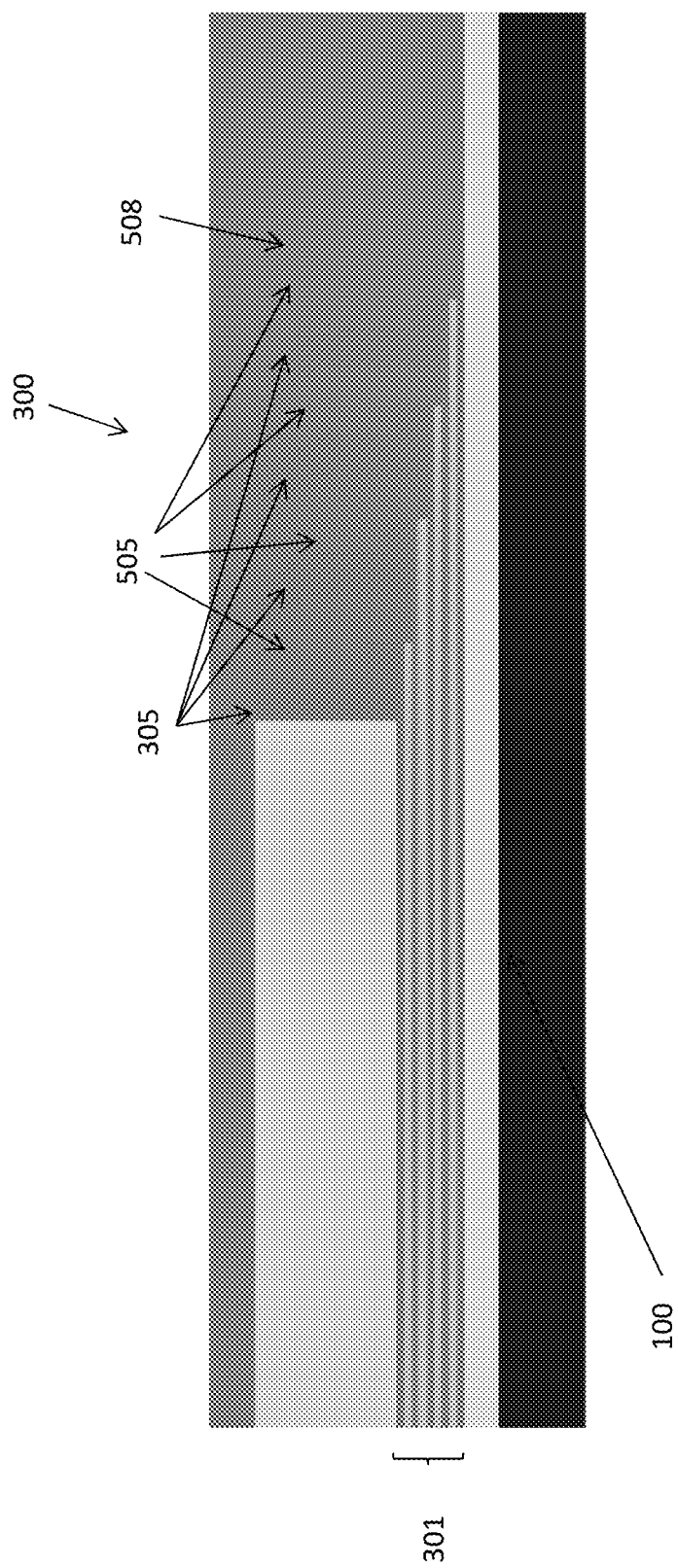

Referring to FIG. 7J, an electrically insulating fill layer 508 is formed over the device, and the fill layer 508 is polished (e.g., using chemical mechanical polishing) to expose an upper surface of each of the electrically conductive sidewall spacers 305. This step may form layer 308 from the planarized fill layer 508 and the insulating sidewall spacers 505 (and optional vertical fill portions 310). In various embodiments the fill layer 508 may include the same material as spacers 505 and 310, or different material.

Figure 7K:
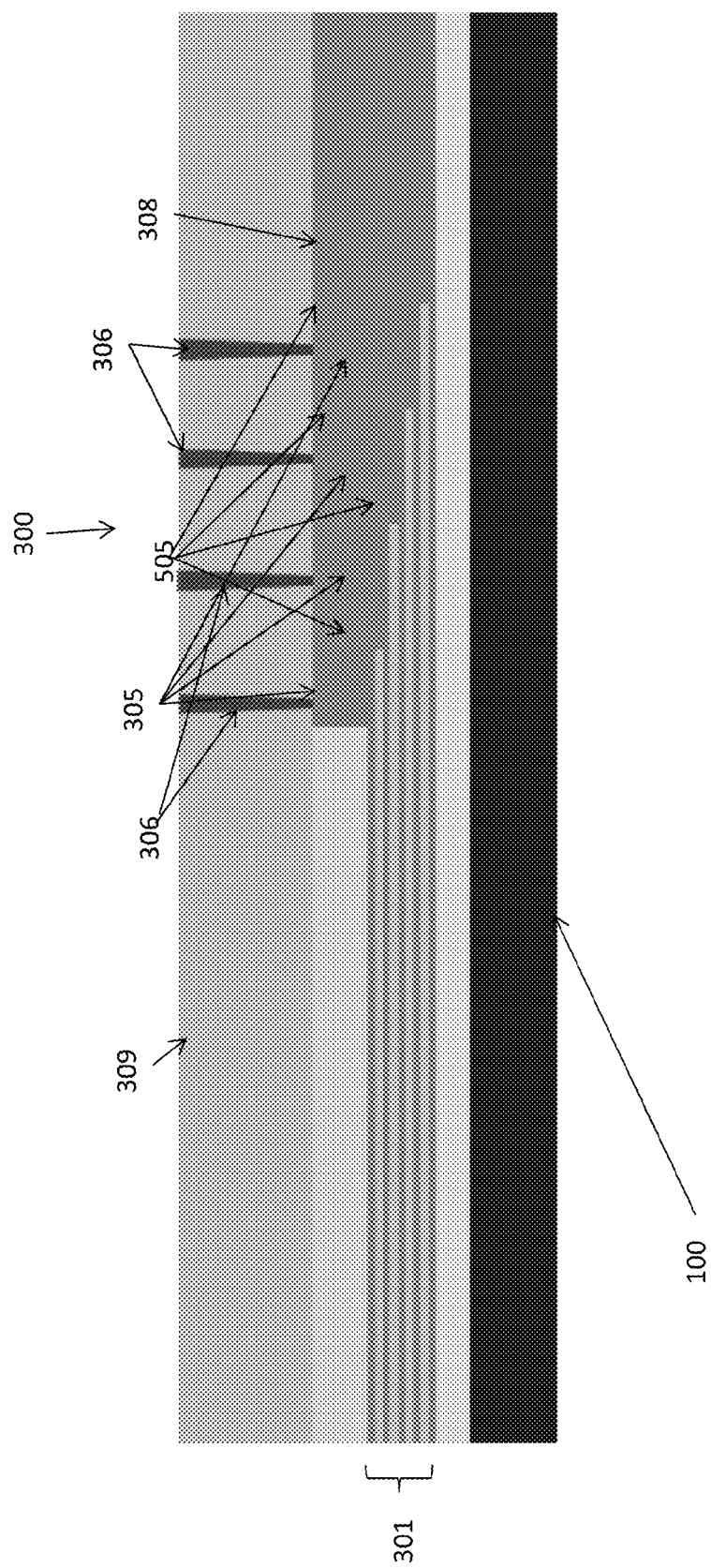

Referring to FIG. 7K, an overlaying insulating layer 309 is formed over the fill layer 308, and via connections 306 are formed extending vertically through the overlaying insulating layer 309 to make electrical contact with at least one of the electrically conductive sidewall spacers 305. The via connections 306 may be formed using any suitable technique, e.g., using lithographic patterning and etching to create holes in layer 309 which are then filled with electrically conductive material. The resulting structure is equivalent to that shown in FIG. 6.

FIG. 8 shows an alternate embodiment of a multi-level contact. The multi-level contact is nearly identical to the structure shown in FIG. 6. However, the conductive sidewall spacers 305 do no have an L-shape. As described above, this may be the result of omitting the use of a liner layers 502 and resulting vertical fill portions 310 during the fabrication of each spacer 305. As will be apparent to one skilled in the art in view of this disclosure, various embodiments may use any combination of L-shaped and non-L-shaped conductive sidewall spacers 305.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A multilevel device, comprising:
at least one device region and at least one contact region having a stack of alternating plurality of electrically conductive layers and plurality of electrically insulating layers located over a substrate, wherein the plurality of electrically conductive layers form a stepped pattern in the contact region, wherein each electrically insulating layer comprises a sidewall and a respective underlying electrically conductive layer in the stack extends laterally beyond the sidewall to a respective sidewall surface; and
a plurality of electrically conductive sidewall spacers located adjacent to a respective sidewall of the electrically insulating layers, wherein each of the electrically conductive sidewall spacers is in electrical contact with a respective underlying electrically conductive layer and is substantially electrically isolated from the other electrically conductive layers in the plurality of electrically conductive layers in the stack, and wherein each of the electrically conductive sidewall spacers includes a sidewall surface that is within a same vertical plane as a sidewall surface of the respective underlying electrically conductive layer.

2. The device of claim 1, wherein each of the plurality of sidewall spacers extends vertically past a set of electrically conductive layers in the stack which overlies the respective electrically insulating layer.

3. The device of claim 2, wherein each of the plurality of sidewall spacers contacts a contact portion of a respective electrically conductive layer corresponding to the stepped pattern, wherein the contact portion extends laterally past any overlying electrically conductive layers in the stack.

4. The device of claim 3, further comprising an electrically insulating fill material that substantially fills a lateral space between each pair of laterally adjacent sidewall spacers.

5. The device of claim 4, wherein the electrically insulating fill material in the contact region comprises a layer having a flat top exposing tops of the plurality of sidewall spacers.

6. The device of claim 1, further comprising:
an overlying insulating layer located over the contact region;
an electrically conductive via connection extending vertically through the overlying insulating layer to make electrical contact with at least one of the plurality of sidewall spacers;
wherein each of the plurality of sidewall spacers extends laterally past the via connection at a location where the via connection contacts the sidewall spacer.

7. The device of claim 6, wherein each of the plurality of sidewall spacers has a lateral cross sectional area that is greater than a lateral cross sectional area of the via connection at the location where the via connection contacts the sidewall spacer.

8. The device of claim 1, wherein at least one of the plurality of sidewall spacers has a substantially L-shaped vertical cross section comprising a upper arm extending substantially vertically from a side of a substantially horizontal lower base arm that has a greater width than the upper arm.

9. The device of claim 8, further comprising a filler material that fills a space defined by the L-shaped vertical cross section between and adjacent to the upper arm and the lower base arm.

10. The device of claim 8, wherein a sidewall surface of each substantially horizontal lower base arm is within a same vertical plane as a sidewall surface of a respective underlying electrically conductive layer.

11. The device of claim 10, wherein the upper arm of each electrically conductive sidewall spacer is laterally offset from the sidewall surface of the electrically conductive sidewall spacer.

12. The device of claim 1, wherein:
the device comprises a vertical NAND device; and
at least one of the electrically conductive layers in the stack comprises or is electrically connected to a word line of the NAND device.

13. The device of claim 12, wherein:
the device region comprises:
a plurality of semiconductor channels, wherein at least one end portion of each of the plurality of semiconductor channels extends substantially perpendicular to a major surface of the substrate; and
a plurality of charge storage regions, each charge storage region located adjacent to a respective one of the plurality of semiconductor channels; and
a plurality of control gate electrodes having a strip shape extending substantially parallel to the major surface of the substrate, wherein the plurality of control gate electrodes comprise at least a first control gate electrode located in the first device level and a second control gate electrode located in the second device level;
a first one of the plurality of electrically conductive layers in the stack is in electrical contact with the first control gate electrode and extends from the device region to the contact region; and a second one of the plurality of electrically conductive layers in the stack is in electrical contact the second control gate electrode and extends from the device region to the contact region.

14. The device of claim 1, wherein:
the device comprises a three dimensional ReRAM device; and
at least one of the electrically conductive layers in the stack comprises or is electrically connected to an electrode of the ReRAM device.

15. The device of claim 1, wherein all top surfaces of the plurality of electrically conductive sidewall spacers are within a same horizontal plane.

16. The device of claim 15, further comprising an insulating layer overlying the alternating stack, wherein a top surface of the insulating layer is within the same horizontal plane including all top surfaces of the plurality of electrically conductive sidewall spacers.

17. The device of claim 15, wherein the same horizontal plane including all top surfaces of the plurality of electrically conductive sidewall spacers is located above a horizontal plane including a top surface of a topmost electrically conductive layer among the plurality of electrically conductive layers.

18. The device of claim 15, wherein at least one sidewall surface of the plurality of electrically conductive sidewall spacers adjoins the same horizontal plane at a non-orthogonal angle.

19. The device of claim 1, wherein at least one of the plurality of electrically conductive sidewall spacers has a non-vertical sidewall having a lateral distance from a vertical line passing through the sidewall surface of the respective underlying electrically conductive layer that increases with a vertical distance with the respective underlying electrically conductive layer.

20. A monolithic, three dimensional array of memory devices located over a silicon substrate, comprising:
an array of vertically oriented NAND strings in which at least one memory cell in a first device level of the array is located over another memory cell in a second device level;
an integrated circuit comprising a driver circuit for the array of memory devices located on the silicon substrate;
at least one device region and at least one contact region having a stack of alternating plurality of electrically conductive layers and plurality of electrically insulating layers located over a substrate, wherein the plurality of electrically conductive layers form a stepped pattern in the contact region, wherein each electrically insulating layer comprises a sidewall and a respective underlying electrically conductive layer in the stack extends laterally beyond the sidewall to a respective sidewall surface; and
a plurality of electrically conductive sidewall spacers located adjacent to a respective sidewall of the electrically insulating layers, wherein each of the electrically conductive sidewall spacers is in electrical contact with a respective underlying electrically conductive layer and is substantially electrically isolated from the other electrically conductive layers in the plurality of electrically conductive layers in the stack, and wherein each of the electrically conductive sidewall spacers includes a sidewall surface that is within a same vertical plane as a sidewall surface of the respective underlying electrically conductive layer.

21. The monolithic, three dimensional array of claim 20, wherein at least one of the electrically conductive layers in the stack comprises or is electrically connected to a word line of the array of vertically oriented NAND strings.

22. The monolithic, three dimensional array of claim 21, wherein:
the device region comprises:
a plurality of semiconductor channels, wherein at least one end portion of each of the plurality of semiconductor channels extends substantially perpendicular to a major surface of the substrate; and
a plurality of charge storage regions, each charge storage region located adjacent to a respective one of the plurality of semiconductor channels; and
a plurality of control gate electrodes having a strip shape extending substantially parallel to the major surface of the substrate, wherein the plurality of control gate electrodes comprise at least a first control gate electrode located in the first device level and a second control gate electrode located in the second device level;
a first one of the plurality of electrically conductive layers in the stack is in electrical contact with the first control gate electrode and extends from the device region to the contact region; and
a second one of the plurality of electrically conductive layers in the stack is in electrical contact the second control gate electrode and extends from the device region to the contact region.

23. The monolithic, three dimensional array of claim 20, wherein at least one of the plurality of sidewall spacers has a substantially L-shaped vertical cross section comprising a upper arm extending substantially vertically from a side of a substantially horizontal lower base arm that has a greater width than the upper arm.

24. The monolithic, three dimensional array of claim 23, further comprising a filler material that fills a space defined by the L-shaped vertical cross section between and adjacent to the upper arm and the lower base arm.

25. The monolithic, three dimensional array of claim 23, wherein a sidewall surface of each substantially horizontal lower base arm is within a same vertical plane as a sidewall surface of a respective underlying electrically conductive layer.

26. The monolithic, three dimensional array of claim 25, wherein the upper arm of each electrically conductive sidewall spacer is laterally offset from the sidewall surface of the electrically conductive sidewall spacer.

27. The monolithic, three dimensional array of claim 20, wherein all top surfaces of the plurality of electrically conductive sidewall spacers are within a same horizontal plane.

28. The monolithic, three dimensional array of claim 27, further comprising an insulating layer overlying the alternating stack, wherein a top surface of the insulating layer is within the same horizontal plane including all top surfaces of the plurality of electrically conductive sidewall spacers.

29. The monolithic, three dimensional array of claim 27, wherein the same horizontal plane including all top surfaces of the plurality of electrically conductive sidewall spacers is located above a horizontal plane including a top surface of a topmost electrically conductive layer among the plurality of electrically conductive layers.

30. The monolithic, three dimensional array of claim 27, wherein at least one sidewall surface of the plurality of electrically conductive sidewall spacers adjoins the same horizontal plane at a non-orthogonal angle.

31. The monolithic, three dimensional array of claim 20, wherein at least one of the plurality of electrically conductive sidewall spacers has a non-vertical sidewall having a lateral distance from a vertical line passing through the sidewall surface of the respective underlying electrically conductive layer that increases with a vertical distance with the respective underlying electrically conductive layer.

* * * * *